/ United States Patent /
Vergnet et al.

(10) Patent No.: US 11,183,970 B2
(45) Date of Patent: Nov. 23, 2021

(54) DEVICE FOR TESTING A SATELLITE SOLAR ARRAY (71) Applicant: AIRBUS DEFENCE AND SPACE SAS, Toulouse (FR)

(72) Inventors: Dominique Vergnet, Toulouse (FR); Marc Sabathe, Toulouse (FR)

(73) Assignee: Airbus Defence and Space SAS, Toulouse (FR)

(*) Notice: Subject to any disclaimer, the term of this patent is extended or adjusted under 35 U.S.C. 154(b) by 0 days.

(21) Appl. No.: 17/256,379

(22) PCT Filed: Jun. 12, 2019

(86) PCT No.: PCT/FR2019/051420
§ 371 (c)(1),
(2) Date: Dec. 28, 2020

(87) PCT Pub. No.: WO2020/002791
PCT Pub. Date: Jan. 2, 2020

(65) Prior Publication Data
US 2021/0249993 A1    Aug. 12, 2021

(30) Foreign Application Priority Data
Jun. 28, 2018   (FR) ..................... 18 55824

(51) Int. Cl.
H02S 50/15    (2014.01)
H01L 31/0443   (2014.01)
(Continued)

(52) U.S. Cl.
CPC .............. H02S 50/15 (2014.12); F21S 8/006 (2013.01); G01R 31/2632 (2013.01); H01L 31/0443 (2014.12); H01L 31/0504 (2013.01)

(58) Field of Classification Search
CPC . H02S 50/15; H01L 31/0443; H01L 31/0504; F21S 8/006
See application file for complete search history.

(56) References Cited

U.S. PATENT DOCUMENTS

| 5,955,885 A | 9/1999 | Kurokami et al. |
| 2004/0020529 A1* | 2/2004 | Schutt ..................... H02S 50/10 136/245 |
| 2016/0359454 A1 | 12/2016 | Naiknaware |

FOREIGN PATENT DOCUMENTS

| JP | 2002-111029 | 4/2002 |
| JP | 2007-078404 | 3/2007 |

(Continued)

OTHER PUBLICATIONS

International Search Report for PCT/FR2019/051420, dated Aug. 9, 2019, 4 pages.
(Continued)

Primary Examiner — Paresh Patel
(74) Attorney, Agent, or Firm — Nixon & Vanderhye P.C.

(57) ABSTRACT

A test device for testing a solar generator of a satellite or solar drone, the solar generator includes an array of solar cells, each junction being capable of converting photons of a respective wavelength band into electric current, the test device includes: an array of light sources including at least one row of light sources, wherein each light source emits light in each of the electrical conversion wavelength bands of the junction(s) of the solar cells, and a control unit for the array of light sources, and capable of controlling the turning on and off of each of the light sources of the array individually, wherein the array of light sources selectively illuminates each solar cell of the solar generator by turning on one or more light sources of the array, with the solar cell receiving an irradiance that is greater than at least 130W/m$^2$.

17 Claims, 7 Drawing Sheets (51) Int. Cl.
  *H01L 31/05*    (2014.01)
  *F21S 8/00*     (2006.01)
  *G01R 31/26*    (2020.01)

(56) References Cited

FOREIGN PATENT DOCUMENTS

| JP | 2011-49474   | 3/2011 |
| JP | 2014-525227  | 9/2014 |
| JP | 2015-43395   | 3/2015 |
| JP | 2017-108106  | 6/2017 |
| JP | 2018-26570   | 2/2018 |
| WO | 2013/011060  | 1/2013 |

OTHER PUBLICATIONS

Written Opinion of the ISA for PCT/FR2019/051420, dated Aug. 9, 2019, 5 pages.
English Translation of JP OA cited in Application No. 2020-571780 dated Jul. 13, 2021, 17 pages.
JP OA cited in Application No. 2020-571780 dated Jul. 13, 2021, 8 pages.

\* cited by examiner

DEVICE FOR TESTING A SATELLITE SOLAR ARRAY

RELATED APPLICATIONS

This application is the U.S. national phase of International Application PCT/FR2019/051420 filed Jun. 12, 2019, which designated the U.S. and claims priority to French Patent Application 18 55824 filed Jun. 28, 2018, the entire contents of each of which are hereby incorporated by reference.

FIELD OF THE INVENTION

The invention relates to a device for testing a solar generator of a satellite or of a solar drone.

The device according to the invention is usable in particular for testing the health of the solar cells that form a solar generator, but also for testing the correct operation of the connections of solar cells and their protective elements.

PRIOR ART

Power to a satellite is supplied by one or more solar generators, each generator comprising an array of solar cells comprising several p-n junctions, typically three p-n junctions. Triple-junction solar cells exhibit a higher electrical conversion efficiency than double-junction cells, although they are more expensive.

Given the difficulties in accessing a satellite once it has been deployed, it is very difficult or even impossible to test or repair its components after its launch, and it is therefore essential to be able to test it on the ground before launch. In particular, solar generators are subjected to several functional tests whose goal is to demonstrate that the performance of the generators will be assured once the satellite is launched, and if necessary to replace defective components before launch.

These tests of correct operation include in particular a verification of the integrity of the electrical circuits and of the performance of their component solar cells. This verification is currently done by a series of unit tests, typically comprising:

Continuity test of the wiring and protective elements, such as bypass diodes for the cells,
Health test of the solar cells,
Test of the allocation and correct connection of the electrical sections to the satellite after integration of the solar generator.

The health test of the solar cells can be achieved by an electroluminescence test, which consists of supplying current to the solar generator and capturing and processing electroluminescence images generated in response to this current, in order to detect any faults. It can also be achieved by a test called a "flash test", which consists of illuminating the solar generator and measuring the electrical power and/or the I-V characteristic generated in response.

The wiring continuity test can be performed manually, by individually polarizing the various strings of solar cells that form the generator.

These different types of tests require disconnecting the solar generator from the satellite and accessing the solar generator's electrical system, in order to connect the measurement and processing electronics. Given the time required for these tests, the solar generator generally must be dismantled from the satellite and brought to a specific area for the test, which adds unwanted handling and therefore the risk of damage to the solar generator and satellite which is undesirable considering the production costs of these parts.

The allocation test can be performed by illuminating different areas of the solar generator and measuring the response at the satellite. This test is therefore carried out in a second step, once the solar generator has been reassembled to the satellite.

The variety of the various tests implemented, and the constraints that arise in terms of connecting to the solar generator and maneuvering it in order to be able to perform each test, render the test protocol long and risky.

The same issues also arise for solar drones, which, due to their significant integrational and lightness constraints, comprise expensive and fragile solar generators which it is important to be able to test without any risk of damaging them. In addition, for solar drones that may have sufficient autonomy to not land at night, it is also advantageous to carry out all the necessary tests before launching the drone in order to avoid an untimely interruption of its flight.

There is therefore a need for a means of testing a solar generator which is faster and which poses less risk to the integrity of the solar generator and of the satellite or drone on which it is mounted.

PRESENTATION OF THE INVENTION

In view of the above, the aim of the invention is to at least partially overcome the disadvantages of the prior art.

In particular, one aim of the invention is to provide a contactless device for testing a solar generator, which is usable for carrying out various types of test.

Another aim of the invention is to provide a test device for conducting health tests on solar cells, and also tests of wiring continuity and of correct connection of the electrical sections to the satellite or to the solar drone.

In this regard, an object of the invention is a device for testing a solar generator of a satellite or of a solar drone, the solar generator comprising an array of single-junction or multi-junction solar cells, each junction being capable of converting photons of a respective wavelength band into electric current, the test device comprising:

an array of light sources, comprising at least one row of light sources, each light source of the array being capable of emitting light in each of the electrical conversion wavelength bands of the junction(s) of the solar cells,
a control unit for the array of light sources, capable of controlling the turning on and off of each of the light sources of the array individually, the array of light sources being further configured to be able to selectively illuminate each solar cell of the solar generator by turning on one or more light sources of the array, with the solar cell receiving an irradiance that is greater than at least 130 W/m$^2$.

In one embodiment, each solar cell is of the multi-junction type, and each light source of the array comprises a plurality of light-emitting diodes, each light-emitting diode being capable of emitting light in an electrical conversion wavelength band of a respective junction of the solar cells.

For example, N being the number of junctions of the solar cells of the solar generator, each light source of the array may comprise a number N of light-emitting diodes, each diode of a light source being capable of emitting light in a wavelength band absorbed by a respective junction of the solar cells.

In one particular embodiment, the solar cells are of the triple-junction type, and each light source of the array comprises:
- a first light-emitting diode capable of emitting light in a wavelength band centered on 450 nm,
- a second light-emitting diode capable of emitting light in a wavelength band centered on 850 nm, and
- a third light-emitting diode capable of emitting light in a wavelength band centered on 940 nm.

Advantageously, the control unit is further capable of individually controlling the turning on, the turning off, and the irradiance of each light-emitting diode of a light source of the array.

Advantageously, the distance between two adjacent light sources of the array is less than or equal to the distance between the centers of two adjacent solar cells.

In one embodiment, the test device further comprises optics suitable for controlling the opening angle of a light beam emitted by each light source. In the case where the light sources comprise LEDs, these optics may be integrated into each LED.

The test device may further comprise a protection device for the solar generator, comprising:
- a transparent screen capable of blocking light rays having a wavelength greater than 1.8 μm, and
- a fan capable of circulating air between the transparent screen and the array of light sources.

The array of light sources is advantageously formed of a plurality of sub-arrays, each sub-array comprising at least one row of light sources.

Another object of the invention is a method for testing a solar generator of a satellite or of a solar drone, the solar generator comprising an array of multi-junction solar cells, each junction being capable of converting photons of a respective wavelength band into electric current, the test method being implemented using a test device according to the above description, and comprising the following steps:
- positioning the array of light sources of the test device to be facing the solar generator,
- by turning on at least one light source of the array, selectively illuminating at least one solar cell of the solar generator,
- measuring a response current of the illuminated solar cell, and
- analyzing the measured response current in order to deduce a healthy or defective state of the solar generator.

Advantageously, the solar generator is assembled to a satellite or a solar drone, and the measured response current is a current supplied to the satellite or solar drone by the solar generator.

In one embodiment, the solar generator is assembled to a satellite, and the test device is configured to be able to simultaneously illuminate all the solar cells of the solar generator, the method comprising a step of testing the turning on of the satellite by simultaneous illumination of all solar cells of the solar generator.

In one embodiment, the solar generator comprises a plurality of strings of solar cells, the solar cells of a string being connected in series, and the method comprises a test of at least one string of solar cells, said test comprising:
- the successive illumination of groups of solar cells of a string, the groups comprising a constant number of solar cells and the successively illuminated groups being offset from one another by one solar cell, and
- based on the response current measured for each group of illuminated solar cells, determining a healthy or defective state of the cells of the string and a healthy or defective state of the electrical contacts between the cells of the string.

Each solar cell of the solar generator may be associated with a bypass diode; the testing of a string of solar cells can then comprise the determination, based on the response current measured for each group of illuminated solar cells, of a healthy or defective state of the bypass diodes associated with the solar cells of the string.

In the case where the solar generator is connected to a regulator, and comprises a plurality of strings of solar cells where the solar cells of a string are connected in series, the method may comprise the selective illumination of one or more strings of solar cells and the determination, based on the measured response current, of a healthy or defective state of the regulator and of the connections between the strings and the regulator.

The test device according to the invention makes it possible to test the health of solar cells of a solar generator without contact and without a specific test interface. Indeed, the device is configured to be able to illuminate each cell with a received irradiance of more than 130 W/m$^2$, which corresponds to one tenth of the irradiance received from the sun in space, and which makes it possible for the solar cells to generate a sufficiently high current to be measurable at the satellite or drone.

It is therefore not necessary to disconnect the solar generator from the satellite or from the drone, which reduces the handling-associated risks as well as the duration of the test.

In addition, the configuration of the array of light sources of the test device allows individually illuminating one or more solar cells of the solar generator. This not only allows determining a healthy or defective state of the solar cells, it also allows, by an appropriate sequence of illumination of groups of solar cells, testing the integrity of the wiring, the correct operation of the bypass diodes, and the allocation, i.e. the correct connection of the solar generator to the satellite or drone.

DESCRIPTION OF FIGURES

Other features, aims, and advantages of the invention will be apparent from the following description, which is purely illustrative and non-limiting, and which is to be read in conjunction with the accompanying drawings in which.

DETAILED DESCRIPTION OF AT LEAST ONE EMBODIMENT OF THE INVENTION

Figure 1A:
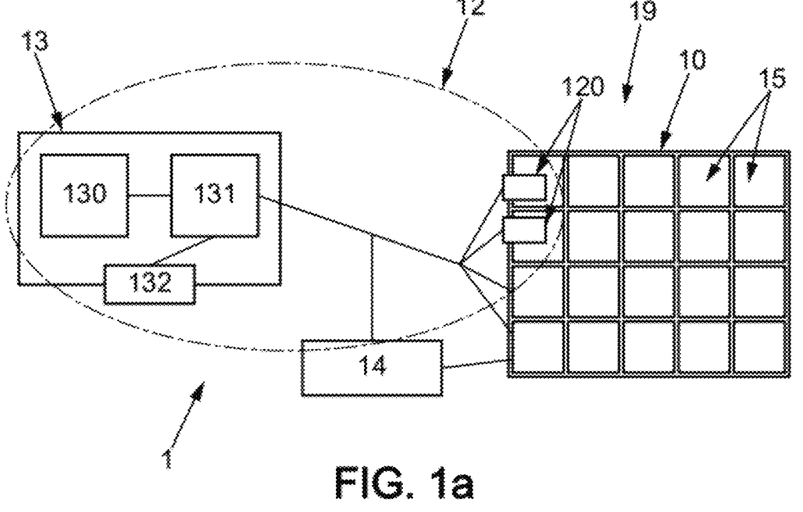
FIG. 1a schematically represents an example of a test device according to one embodiment of the invention, FIG. 1b schematically represents a support frame for an array of light sources, FIG. 1c schematically represents a profile view of an array of light sources mounted on a frame, FIG. 1d schematically represents an example of a test device according to another embodiment of the invention.

With reference to FIG. 1a, we will now describe a device 1 for testing a solar generator which allows conducting a set of contactless verifications of the correct operation of the solar generator and manipulating the solar generator in order to access its internal components. The solar generator is advantageously intended to be onboard a satellite S or a solar drone, to ensure the supply of power thereto.

Figure 4:
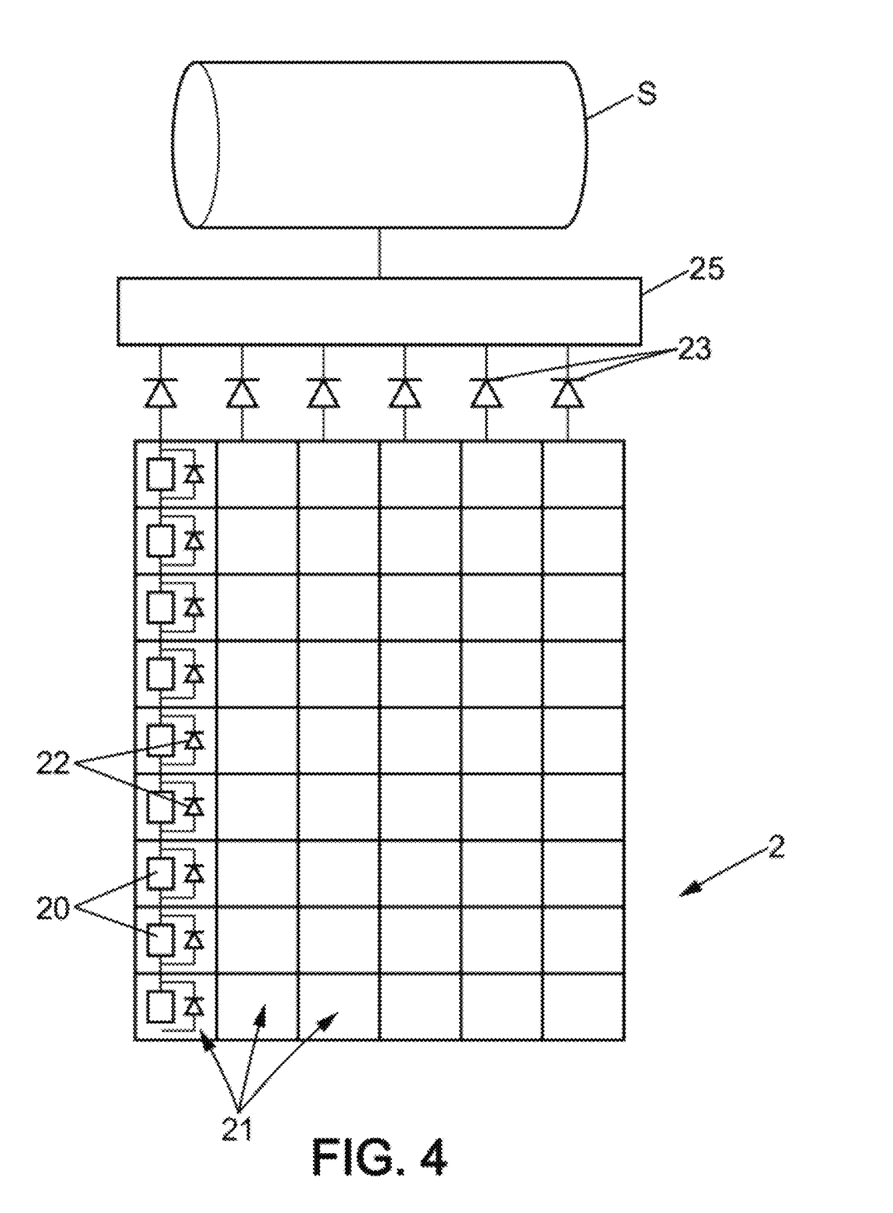

An example of a solar generator 2 is schematically represented in FIG. 4. It comprises an array of solar cells 20 comprising at least one junction, and preferably at least two junctions—the term multi-junction cells is then used—each junction of a solar cell being capable of converting photons of a respective wavelength band into electric current, by photovoltaic effect.

Figure 5:
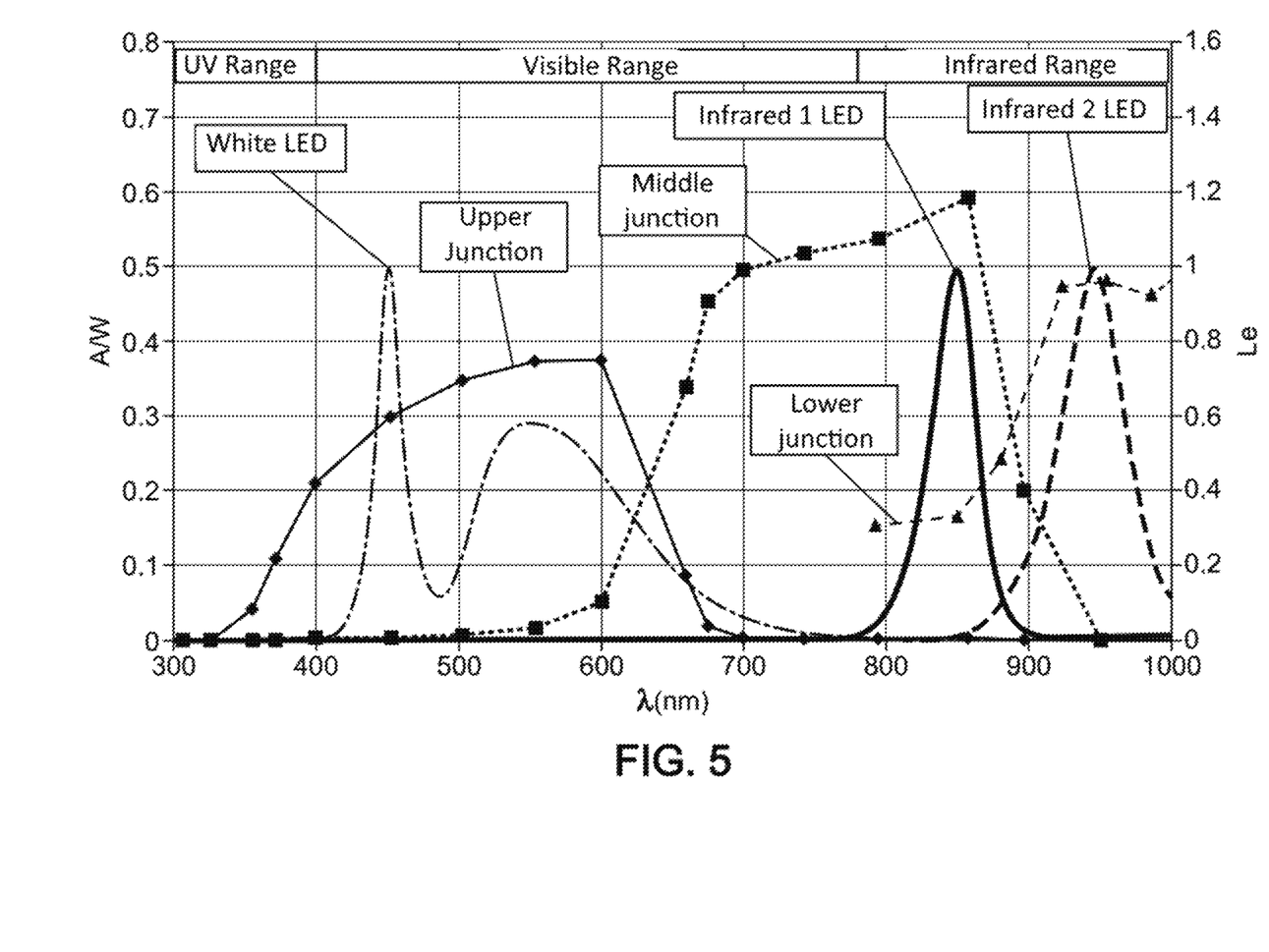
FIG. 5 shows an example of the emission characteristics of light-emitting diodes of a test device compared to the electrical conversion characteristics of the solar cells of the solar generator to be tested, FIG. 6 schematically represents the main steps of a method for testing a solar generator according to one embodiment of the invention.

In the case of powering a satellite, the solar cells 20 of the solar generator can typically be triple-junction cells, for example such as the cell models 3G28 or 3G30 offered by the company Azur Space, their spectral response being shown in FIG. 5, where the x axis represents the wavelengths and the left y axis represents the photoelectric conversion rate of the cell (also called External Quantum Efficiency EQE).

For example, a triple-junction cell may comprise:
  an upper junction, suitable for converting photons in a wavelength band between 400 and 600 nm into electric current,
  a middle junction, suitable for converting photons in a wavelength band between 650 and 900 nm into electric current, and
  a lower junction, suitable for converting photons in the near-infrared into electric current, for example in a wavelength band between 900 and 1000 nm.

"Array" of solar cells is understood to mean that the solar cells are arranged in a regular arrangement, with a constant distance between two neighboring solar cells (which may comprise a first distance in a first direction and a second distance in a second direction orthogonal to the first). Typically, the solar cells are distributed in rows all comprising the same number of cells. For example, an array of solar cells may have a substantially rectangular shape, and comprise a number N*R of solar cells distributed into N rows each comprising R cells. In the case where N=R, the array is substantially square in shape.

The solar cells 20 of the solar generator 2 are distributed in strings 21, each string comprising a plurality of solar cells 20 connected to one another in series. In FIG. 4, six strings of solar cells are shown as an example.

In addition, the solar generator 2 may comprise one or more bypass diodes 22, a bypass diode being connected in parallel with one or more solar cells 20 and making it possible to short-circuit the solar cell(s) to which it is connected if they are shaded. For example, the solar generator 2 may comprise one bypass diode 22 for each solar cell as is schematically represented in FIG. 4, where only one of the six strings of solar cells is illustrated.

The solar generator 2 may also comprise a string blocking diode 23 for each string 21, making it possible to prevent current from flowing in a string in the reverse direction in the event of shading.

Finally, the solar generator is connected to a power regulator 25 of the direct energy transfer type (also called DET) or of the maximum power point tracking type (also called MPPT), depending on the needs of the satellite. The current converted by the regulator 25 can then be used to power the satellite S or drone in which the solar generator is mounted.

Before launching the satellite or drone, the correct operation of the solar generators must be verified.

Returning to FIG. 1a, the device 1 for testing a solar generator comprises a lighting device 19 comprising an array 10 of light sources 11, where here again the term array is interpreted to mean a set of several light sources distributed in a regular arrangement, for example with a constant distance between two adjacent light sources (possibly comprising a first distance in a first direction and a second distance in a second direction orthogonal to the first). Preferably, the light sources 11 of the array are distributed in rows all comprising the same number of light sources. The light sources are arranged on a flat support, thus forming a panel of a size and geometry that can be configured according to the solar generator to be tested.

In addition, each light source 11 of the array 10 is capable of emitting light in at least one of the electrical conversion wavelength bands of the junctions of the solar cells.

In one embodiment, each light source 11 of the array 10 is capable of emitting light in each of the electrical conversion wavelength bands of the junctions of the solar cells.

This makes it possible, by illuminating a solar cell by means of a light source, to simultaneously excite all the junctions of the solar cell and thus to allow the solar cell to produce/generate electric current.

For example, each light source 11 may comprise at least one light-emitting diode (LED hereinafter) for each junction of the solar cell, each light-emitting diode being capable of generating light in a wavelength band absorbed by a respective junction of the solar cell.

It is understood that the nature of the light source may vary depending on the type of solar cells, and more specifically the emission ranges of the LEDs may vary depending on the junctions of the solar cells.

As a non-limiting example, in order to be suitable for at least a 3G28 type of triple-junction cell whose spectral response is shown in FIG. 5, each light source 11 of the array 10 may advantageously comprise three LEDs:
  a first LED capable of emitting light in a wavelength band centered on 450 nm, in order to emit light in the absorption band of the upper junction of the cell (400-600 nm); this is the case of a white LED for which the emission spectrum is also shown in FIG. 5,
  a second LED capable of emitting light in a wavelength band centered on 850 nm, in order to emit light in the absorption band of the middle junction of the cell (650-900 nm); this is the case of a first infrared LED for which the emission spectrum is shown in FIG. 5, and
  a third LED capable of emitting light in a wavelength band centered on 940 nm, in order to emit light in the absorption band of the lower junction of the cell (900-1000 nm); this is the case of the second infrared LED for which the emission spectrum is shown in FIG. 5.

In FIG. 5, the right y axis represents the spectral radiance of the LEDs.

Alternatively, it is also possible that each light source 11 has several LEDs for each junction of a solar cell, for example two or three LEDs which allow illumination in the wavelength band of each junction.

In another embodiment, the light sources 11 of the array are capable of emitting light in a single electrical conversion wavelength band of the solar cells. In this case, and as is schematically shown in FIG. 1d, the lighting device 19 may also comprise, in order to illuminate solar cells with multiple junctions, at least one secondary light source 18 capable of emitting light in the other electrical conversion wavelength band(s) of the solar cells.

More generally, this case could also apply if the light sources 11 are capable of illumination in more than one wavelength band, at most N-1 electrical conversion wavelength bands of the solar cells corresponding to N-1 junctions, N being the number of junctions of a cell.

Returning to FIG. 1a, the test device 1 also comprises a control unit 12 for the lighting device. The control unit is suitable in particular for selectively controlling the turning on and off of each of the light sources 11 of the array 10, individually. Advantageously, the control unit 12 is also suitable for controlling the secondary light source(s) 18. In this regard, the control unit 12 may comprise a computer 13 comprising:
- a memory 130, storing instructions that can be executed by a processor,
- a processor 131, suitable for executing instructions stored in the memory in order to send commands to the light sources to turn them on or off, and
- a human-machine interface 132, comprising for example a screen, possibly touch-sensitive, in order to display information relating to the on or off state of the sources, and means for entering a command from an operator, in order to control the turning on or off of the sources.

Figure 3A:
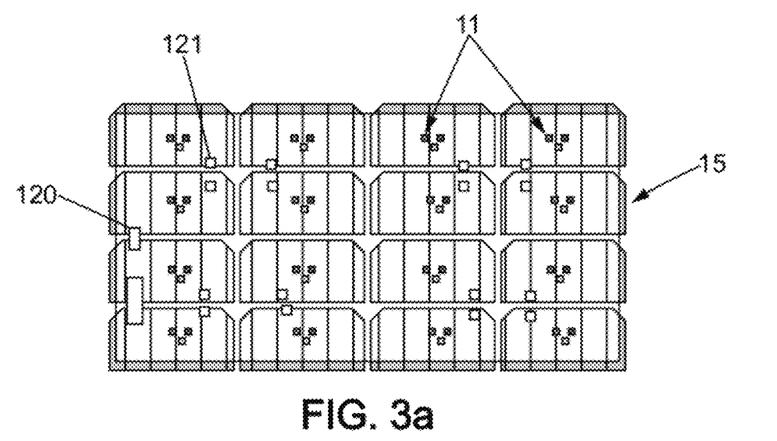
FIGS. 3a and 3b show two example configurations of an array of light sources of a test device, FIG. 4 schematically represents an example of a solar generator of a satellite.
Figure 3B:
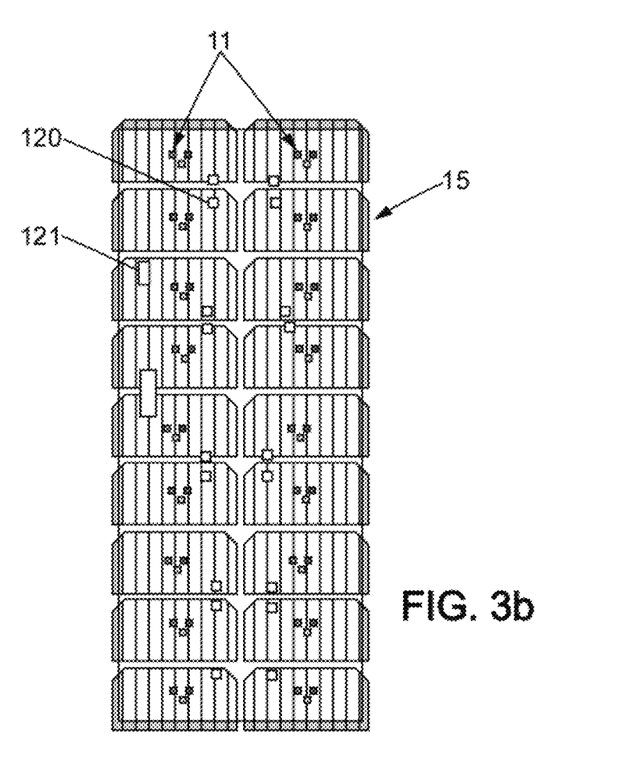

The control unit 12 may also comprise, with reference to FIGS. 3a and 3b, at least one microcontroller 120 connected to a respective subset of light sources of the array 10 and capable of converting the commands of the processor into instructions for controlling the light sources. The control unit 12 may lastly comprise, for each light source, a low-voltage power transistor 121 suitable for receiving the instructions from the microcontroller and for selectively switching according to the instructions to power or not power the sources.

Advantageously, the control unit 12 may also be suitable for controlling and varying the irradiance emitted by the light sources respectively in each wavelength band corresponding to a respective junction of a solar cell. Thus, in the case where the light sources comprise at least one LED per junction of a solar cell, the control unit 12 is advantageously suitable for individually controlling the turning on, the turning off, and the light-emitting power of each LED.

Finally, returning to FIG. 1a, the test device 1 further comprises a power supply 14 for the array 10 of light sources, and where appropriate for the secondary source or sources 18. This supply converts the voltage of the electrical grid (220V, single-phase or three-phase for example) into a voltage suitable for the arrays. The choice of voltage is determined so as to minimize the current powering the arrays and typically can be selected between 10 and 40V.

The lighting device is therefore capable of being able to illuminate each solar cell of the solar generator in each wavelength band corresponding to a junction of the cell, and is capable of allowing individually switchable lighting for each solar cell for at least one of the junctions, in order to be able to selectively switch each cell between a state where it does not deliver current (at least one junction is not illuminated) and a state where it delivers current during normal operation (all the junctions are illuminated).

Indeed, in the case where the light sources 11 of the array 10 are capable of emitting light in the wavelength bands corresponding to each of the junctions of the solar cells, the switching of each light source makes it possible to change from one state to another for each cell.

In the case where the light sources 11 only illuminate in one wavelength band, with solar cells having multiple junctions, and where the lighting device 19 further comprises one or more secondary light sources 18 for the other junctions, it is sufficient to illuminate the solar generator with the secondary source or sources 18 and to cause the light sources of the array 10 to switch in order to activate the missing junction and thus switch from one state to another for each cell.

In addition, the lighting device is suitable for illuminating the solar cells with an irradiance received by the solar cell that is greater than or equal to at least 130 W/m$^2$, which corresponds to the cumulative irradiance in all the wavelength bands corresponding to all the junctions.

This ensures that when a solar cell is illuminated, it is illuminated with sufficient irradiance to cause the solar cell to generate a measurable electric current, thus making it possible to evaluate, by analysis of the response current, whether or not the illuminated solar cell is functional. This irradiance is also about one-tenth of the irradiance received from the sun by the solar cells of a solar generator of a satellite during use in space.

To make it possible to switch each cell individually, the array 10 of light sources preferably comprises at least as many light sources as the solar generator comprises solar cells, so that at least one light source corresponds to a given solar cell, and so that turning on the source causes illumination of the corresponding cell.

In other words, the distance between two light sources is less than or equal to the distance between the centers of two solar cells of the solar generator.

Alternatively, the array 10 of light sources may comprise light sources in a number that is a multiple of the number of solar cells of the generator.

In addition, the greater the surface density of the light sources of the array 10, the more the test device can be adapted to a variety of types of solar generators, since then the light sources can be grouped into variable configurations according to the solar generator to be tested.

For example, the solar generators conventionally used for satellites have a density of solar cells such that the distance between the centers of two adjacent solar cells is typically between 4 and 14 cm. Advantageously, the array of light sources of the test device can have a density of light sources that is greater than the density of the solar cells, corresponding to a distance between two adjacent light sources of less than 5 cm, preferably less than 1 cm, for example 5 mm.

It is understood, in the case where the lighting device 19 also comprises one or more secondary light sources 18, that the requirements concerning the individual lighting of each solar cell only apply to the array 10 of light sources 11 since it is this array 10 which allows individually switching the cells, and the secondary light source(s) can be less dense for a more diffuse lighting. Thus each secondary light source could cover several cells, or even the entire generator.

Figure 2A:
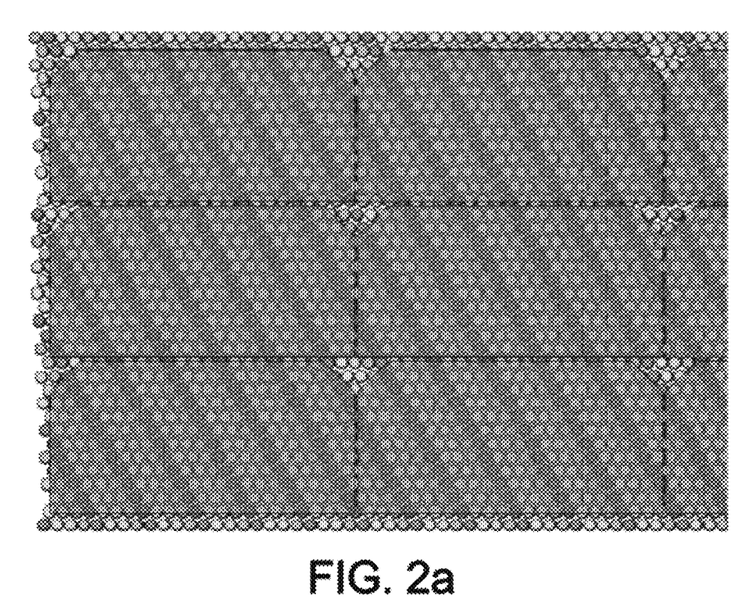
FIG. 2a shows an example of a light source comprising four LEDs of different emission spectra.

To achieve high surface densities of the light sources, the use of housings in which the LEDs are juxtaposed or superimposed, and in which each LED has integrated optics in order to reduce the angular opening of the emitted beam to 10° or less, will be preferred. Represented in FIG. 2a is an example of a light source suitable for cells with four junctions, comprising four LEDs whose emission bands are respectively centered on four different wavelengths, the four LEDs being mounted on a common board and each LED comprising integrated optics which allow reducing the angular opening of the beam to 10°. At a distance of 10 cm, the beam generated by the example shown has a diameter of 23 mm and therefore makes it possible to significantly illuminate a single cell of the generator.

Figure 2B:
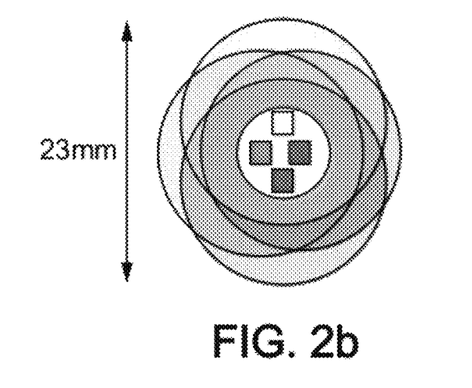
FIG. 2b shows an example of a high density configuration of LEDs.

Alternatively, represented in FIG. 2b is an example of a high density array comprising rows of LEDs adapted for four junctions of solar cells, the rows of LEDs being organized in a compact manner. In the example shown, the pitch between two adjacent LEDs is 4 mm in the horizontal direction and in the direction defined by a row. We can therefore group the LEDs so that a cell of a solar generator is individually illuminated in variable configurations according to the configuration of the solar cells.

In one embodiment, the array 10 of light sources comprises a plurality of sub-arrays 15 which can be assembled together, each sub-array 15 able to be individually powered and connected to the computer 13. In this regard, each sub-array then comprises a microcontroller 120 making it possible to control all of the light sources of the sub-array.

Each sub-array 15 comprises at least one, and preferably several light sources 11. Advantageously, a sub-array 15 comprises at least one row of light sources 11.

Figure 1B:
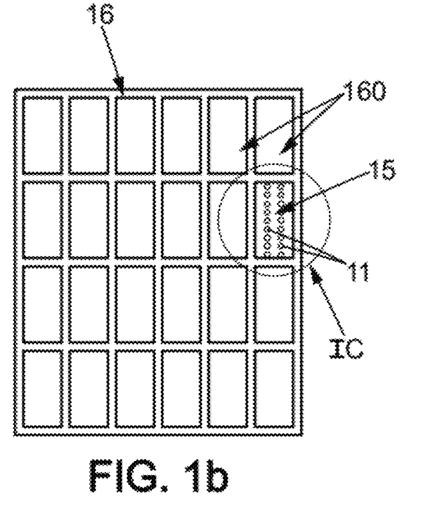

Advantageously, the test device 1 further comprises a frame 16, schematically represented in FIG. 1b, and allowing the assembly of the sub-arrays to form an array of the desired geometry. The frame may for example comprise a set of locations 160, each location being capable of receiving a sub-array, for example by screwing or bolting or snap-fitting.

This organization into sub-arrays allows making the test device modular according to the geometry of the solar generator to be tested. Indeed, it is then possible to select a suitable number of sub-arrays, and to assemble them in a configuration determined on the basis of said geometry.

In FIGS. 3a and 3b, two possible examples of sub-arrays have been represented. In a first embodiment shown in FIG. 3a, a sub-array comprises four rows of four light sources 11. In a variant shown in FIG. 3b, a sub-array comprises two rows of nine light sources 11.

Furthermore, in order to be able to selectively illuminate a solar cell 20 in at least one wavelength band corresponding to a junction, the test device advantageously comprises optics (not shown) making it possible to control, and advantageously reduce, the opening angle of the light beam emitted by each source 11. These optics may for example comprise one or more lens(es), and/or one or more diaphragm(s). As already described above, the optics may also be integrated directly into the LEDs to allow increasing the density of the LEDs.

The value of the maximum opening angle not to be exceeded depends on other parameters, in particular the distance between the solar cells and the light sources. Typically, this distance is preferably greater than 5 cm, because below that there is a risk of contact and therefore of damage, to the solar generator by the test device. This distance is preferably less than 15 to 20 cm, because beyond that there is a risk of blinding the operators working near the test device.

For example, the distance between the solar cells and the light sources may be 10 cm, and the control optics of the light sources may be suitable for reducing the opening angle of the light beam to an angle less than 15°, for example equal to 10°.

Figure 1C:
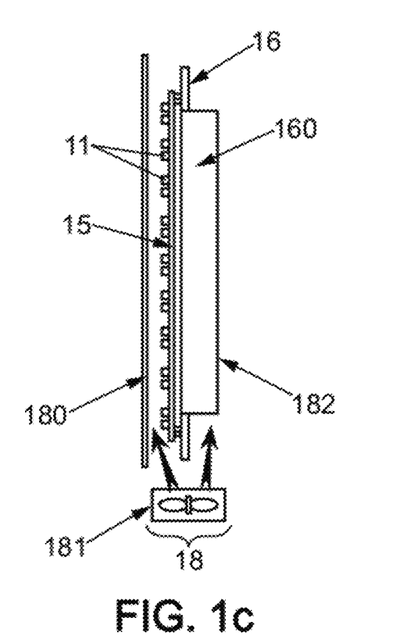
Figure 1D:
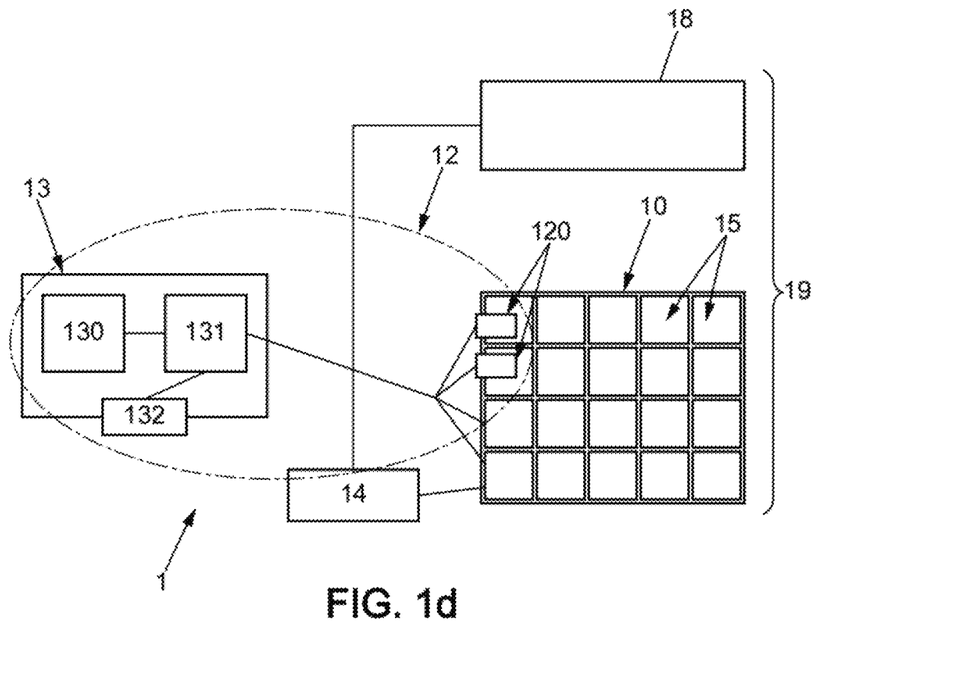

The irradiance received by the solar cells also depends on the density of the light sources, the irradiance produced by the light sources, the distance, and the opening angle of the light beam. In an embodiment in which there is one light source per solar cell of the solar generator, each source being capable of generating light in each wavelength band corresponding to a junction of a cell, and each source 11 being, during the test, placed at a distance of between 5 and 15 cm from the solar generator and having an opening angle of less than 15°, the light source is advantageously configured to generate an irradiance of 1 to 2 Watts per 10 $cm^2$. Given the irradiance received by the solar generator, the test device 1 advantageously comprises a device 18 for protecting the solar generator. This protection device 18 advantageously comprises a transparent screen 180 extending between the light sources 11 of the array and the solar cells, capable of providing both mechanical protection, in the event of failure of the light sources (protection, confinement of the pollution generated), and thermal protection. In this regard, the transparent screen 180 is advantageously suitable for blocking infrared rays of a wavelength greater than 1.8 µm in order to limit the warming of the solar generator. With reference to FIG. 1c, this transparent screen 180 may be mounted on the frame 16, at a distance from it that enables positioning the array 10 of light sources while maintaining a space between the light sources and the screen to allow the circulation of air.

In this regard, the protection device 18 may also comprise a fan 181 capable of bringing fresh air into the space between the light sources and the screen 180. Finally, the protection device 18 may also comprise a radiator 182 on the rear face of the array of light sources, in other words the face of the array oriented away from the solar generator, the radiator 182 being capable of removing the heat produced by the sources, and thus contributing to the thermal protection of the solar generator.

Advantageously, but optionally, each light source 11 of the array 10 may also be orientable, in order to be able to be adapted to several geometries of solar generator and to allow the most precise illumination possible of the individual solar cells.

The test device 1 described above makes it possible, depending on its use, to perform several verifications of the correct operation of the solar generator.

Figure 6:
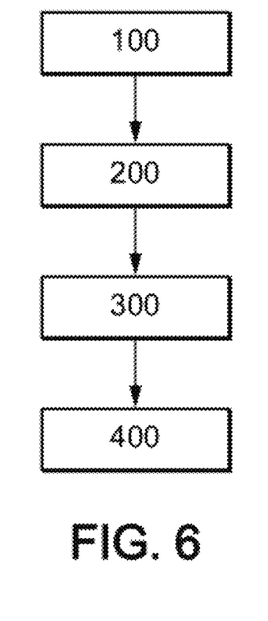

Referring to FIG. 6, a method for testing a solar generator using the test device described above comprises the positioning 100 of the array of light sources opposite the array of solar cells of the solar generator.

Advantageously, the test device has been configured beforehand for the solar generator to be tested, both in the number and arrangement of the light sources, and in the nature and the emission spectra of the light sources.

For example, in the case where the array of light sources is composed of sub-arrays, the test device has been configured by selecting the number and arrangement of the sub-arrays that allow testing the entire solar generator, and assembling them according to this configuration.

In addition, the array 10 of light sources, and preferably the frame 16 on which the array is mounted, are advantageously fixed to a movable carriage (not shown), advantageously comprising means for adjusting the position and orientation of the array 10 of light sources mounted thereon. It is therefore possible to mount the array 10 of light sources on the carriage, then bring the carriage to the solar generator and make the adjustments to position the light sources opposite the solar cells.

Advantageously, the array of light sources is positioned so that at least one light source is located opposite each solar cell, at a distance of less than 20 cm, and preferably less than 15 cm, but greater than 5 cm.

Then the method comprises the illumination 200 of at least one solar cell of the solar generator in all the wavelength bands corresponding to the junction(s) of the solar cell, by turning on at least one light source 11 of the array, and where appropriate the secondary source. Various embodiments of this step will be described below.

In the event that the lighting device only comprises the array 10 of light sources 11, this step is implemented by turning on one or more light sources in order to correspond to the cell or cells for which the generation of current is to be activated.

In the case where the lighting device comprises one or more secondary sources, this step comprises the turning on of the secondary source to illuminate at least the cell or cells for which it is desired to activate the generation of current, and the turning on of one or more light sources 11 of the array corresponding to the cell or cells, this turning on of the sources 11 enabling the switching of the cells.

The method then comprises the measurement 300 of a response current of the illuminated solar cell or cells. The measured response current is preferably the current supplied to the satellite or drone, because it is possible to access this current without accessing the internal electrical connections of the solar generator (for example the connections between two cells or two strings), and therefore this minimizes the risk of damage from handling the solar generator.

The measured response current is then analyzed during a step 400, by an operator or by an algorithm implemented by a processor, in order to deduce a healthy or defective state of the solar generator. The analysis performed depends on the type of illumination implemented and the nature of the test that is performed. It may comprise for example, although this is not limiting, the comparison of a measured current value to a threshold determined according to the number of illuminated cells, and the detection of a malfunction if the measured current is below said threshold.

Satellites are sometimes equipped with an automatic start feature if the supply current generated by the solar generators exceeds a predetermined threshold (corresponding to at least partial illumination by the sun on the solar generators).

In one embodiment, this functionality can be tested, as well as the correct connection of the solar generator to the satellite, by simultaneously turning on all light sources in order to illuminate the entire solar generator.

Alternatively, the method comprises the selective illumination 200 of a string of cells, by simultaneous illumination of all cells of the string, and the analysis of the output current allows verifying the correct connection of the string to the satellite or to the drone, the integrity of the wiring, the correct allocation of the string to a path of the regulator 25 which should correspond to it, the correct operation of the regulator, as well as the correct operation of the corresponding string blocking diode.

Additionally, if the regulator provides a measurement of the string input voltage, a short-circuit type of failure of a bypass diode of the string will reduce the open circuit voltage of that string.

Alternatively, if the regulator is of the MPPT type, the method may comprise an illumination 200 simulating a shading of part of the solar generator, in order to verify the correct operation of the MPPT regulator. It is then verified that the power of the satellite's supply current is the maximum power when taking into account the shaded cells.

The method may also comprise the successive illumination 200 of groups of solar cells of a string, the groups comprising a constant number of solar cells and the successively illuminated groups being offset from one another by a single solar cell, this illumination forming a progressive sweep of the string.

The evolution of the current during this sweep makes it possible to detect a malfunction of a cell or of the corresponding bypass diode, or a faulty electrical contact between cells in the string.

For example, if the current is constant during the sweep but undergoes a localized decrease, then one can deduce a malfunction of the cell or of the bypass diode last added to the group, corresponding to the decrease in current.

An additional test can make it possible to distinguish whether the malfunction comes from the cell or from the associated bypass diode: this test comprises firstly the illumination of the cell arranged upstream of the one where the malfunction is located, then the malfunctioning one, and analysis of the current for each illuminated cell. If no current is measurable when the upstream cell is illuminated, and when the next cell is illuminated a current is detected, then we can deduce that the bypass diode is defective and is in open circuit.

On the other hand, if a current is detected when the cell placed upstream is illuminated, and this current decreases when the next cell is illuminated, then we can deduce that the cell is defective or that the bypass diode is short-circuited.

The test device presented above thus makes it possible to perform a set of tests on a solar generator without handling or coming in contact with the solar generator, which reduces the risk of damage. In addition, individually stressing the solar cells makes it possible to test the operation of identified cells or strings, which allows accurately detecting the location of a failure.

The invention claimed is:

1. A test device for testing a solar generator of a satellite or of a solar drone, the solar generator comprising an array of single-junction or multi-junction solar cells, each of the single-junction or multi-junction solar cells of the array configured to convert photons of a respective wavelength band into electric current,
   the test device comprising:
   a lighting device configured to emit light in each of the respective wavelength bands of electrical conversion wavelengths of the junction(s) of the solar cells, the lighting device comprising an array of light sources, comprising at least one row of the light sources, each of the light sources of the array configured to emit light in at least one electrical conversion wavelength band of the junction(s) of the solar cells,
   a control unit for the array of light sources, configured to control the turning on and off of each of the light sources of the array individually,
   the array of the light sources further configured to selectively illuminate each of the solar cells of the solar generator by turning on one or more light sources of the array, and
   the lighting device configured to illuminate each of the solar cells of the solar generator, with each of the solar cells receiving an irradiance greater than at least 130W/m$^2$.

2. The test device according to claim 1, wherein each solar cell is of the multi-junction solar cells, and each of the light sources of the array is configured to emit light in each of the electrical conversion wavelength bands of the solar cell junction(s).

3. The test device according to claim 2, wherein each light source of the array comprises a plurality of light-emitting diodes, and each of the light-emitting diodes is configured to emit light in an electrical conversion wavelength band of a respective one of the junctions of the solar cells.

4. The test device according to claim 3, wherein, N being a number of the junctions of the solar cells of the solar generator, and wherein each of the light sources of the array comprises the number N of light-emitting diodes, and each diode of one of the light sources is configured to emit light in the wavelength band absorbed by the junction of the solar cell.

5. The test device according to claim 4, wherein the solar cells are of a triple-junction solar cell, and each of the light sources of the array comprises:
   a first light-emitting diode configured to emit light in a wavelength band centered on 450 nm,
   a second light-emitting diode configured to emit light in a wavelength band centered on 850 nm, and
   a third light-emitting diode configured to emit light in a wavelength band centered on 940 nm.

6. The test device according to claim 2, wherein the control unit is configured to individually control the turning on, the turning off, and the irradiance of each of the light-emitting diodes for a respective one of the light sources of the array.

7. The test device according to claim 1, wherein each of the solar cells is of the multi-junction solar cell, each of the light sources of the array is configured to emit light in a single electrical conversion wavelength band of the junction of the solar cells, and the lighting device further comprises at least one secondary light source configured to emit light in each of the other electrical conversion wavelength bands of the junctions of the solar cells.

8. The test device according to claim 1, wherein a distance between two adjacent ones of the light sources adjacent of the array is less than or equal to a distance between centers of two adjacent ones of the solar cells.

9. The device according to claim 1, further comprising optics configured to control an opening angle of a light beam emitted by each light source.

10. The test device according to claim 1, further comprising a protection device for the solar generator, comprising:
   a transparent screen configured to block light rays having a wavelength greater than 1.8 μm, and
   a fan configured to circulate air between the transparent screen and the array of the light sources.

11. The test device according to claim 1, wherein the array of the light sources is formed of a plurality of sub-arrays, and each of the sub-arrays comprise at least one row of the light sources.

12. A method to test the solar generator of the satellite or of the solar drone, the solar generator comprising the array of the single-junction or multi-junction solar cells, each of the junctions configured to convert photons of a respective wavelength band into electric current, the test method being implemented using the test device according to claim 1, and comprising the following steps:
   positioning the array of the light sources of the test device to be facing the solar generator,
   by turning on at least one of the light sources of the array, selectively illuminating at least one of the solar cells of the solar generator in all of the electrical conversion wavelength bands of each of the junctions of the solar cell,
   measuring a response current of the illuminated solar cell, and
   analyzing the measured response current in order to deduce a healthy or defective state of the solar generator.

13. The method according to claim 12, wherein the solar generator is assembled to the satellite or the solar drone, and the measured response current is a current supplied to the satellite or the solar drone by the solar generator.

14. The method according to claim 12, wherein the solar generator is assembled to the satellite, and the test device is configured to simultaneously illuminate all the solar cells of the solar generator, the method comprising a step of testing the turning on of the satellite by the simultaneous illumination of all of the solar cells of the solar generator.

15. The method according to claim 12, wherein the solar generator comprises a plurality of strings of the solar cells, the solar cells of each of the strings being connected in series,
   the method comprising a test of at least one of the strings of the solar cells, said test comprising:
   successive illumination of groups of the solar cells of the strings, the groups comprising a constant number of the solar cells and the successively illuminated groups being offset from one another by one of the solar cells, and
   based on a response current measured for each of the groups of the illuminated solar cells, determining a healthy or defective state of the solar cells of the string and a healthy or defective state of electrical contacts between the solar cells of the string.

16. The method according to claim 12, wherein each of the solar cells of the solar generator is associated with a bypass diode, and the test of the string of the solar cells further comprises a determination, based on the response current measured for each of the groups of illuminated solar cells, of a healthy or defective state of the bypass diodes associated with the solar cells of the string.

17. The method according to claim 12, wherein the solar generator is connected to a regulator and comprises a plurality of the strings of the solar cells, the solar cells of the string being connected in series, and the method comprises selective illumination of one or more of the strings of the solar cells, and a determination, based on the measured response current, of a healthy or defective state of the regulator and of connections between the strings and the regulator.

* * * * *